United States Patent
Bao et al.

(10) Patent No.: US 9,184,144 B2
(45) Date of Patent: Nov. 10, 2015

(54) INTERCONNECT PILLARS WITH DIRECTED COMPLIANCE GEOMETRY

(75) Inventors: Zhongping Bao, San Diego, CA (US); James D. Burrell, San Diego, CA (US); Shiqun Gu, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 13/187,694

(22) Filed: Jul. 21, 2011

(65) Prior Publication Data

US 2013/0020711 A1    Jan. 24, 2013

(51) Int. Cl.
*B32B 37/14*    (2006.01)
*H01L 21/28*    (2006.01)
*H01L 23/00*    (2006.01)

(52) U.S. Cl.
CPC ............... *H01L 24/14* (2013.01); *H01L 24/05* (2013.01); *H01L 24/11* (2013.01); *H01L 24/13* (2013.01); *H01L 24/16* (2013.01); *H01L 24/17* (2013.01); *H01L 24/03* (2013.01); *H01L 24/742* (2013.01); *H01L 24/81* (2013.01); *H01L 2224/0345* (2013.01); *H01L 2224/0401* (2013.01); *H01L 2224/056* (2013.01); *H01L 2224/05011* (2013.01); *H01L 2224/05015* (2013.01); *H01L 2224/05017* (2013.01); *H01L 2224/05558* (2013.01); *H01L 2224/1146* (2013.01);

(Continued)

(58) Field of Classification Search
CPC ... B32B 37/14; H01L 21/28; H01L 21/76885; H01L 2021/60022; H01L 2021/60225; H01L 23/48; H01L 24/10

USPC .......... 257/773, 779, 786, E23.021, E23.024
See application file for complete search history.

(56) References Cited

U.S. PATENT DOCUMENTS 3,871,014 A * 3/1975 King et al. ............... 257/779
5,508,561 A    4/1996 Tago et al.
(Continued)

FOREIGN PATENT DOCUMENTS

EP    0514723 A1    11/1992
EP    1011141 A2    6/2000
(Continued)

OTHER PUBLICATIONS

Ghulghazaryan R., et al.,"Physics based full-chip scale modeling of copper electrochemical deposition", Armenian Journal of Physics, vol. 1, No. 2, 2008, pp. 169-173, XP055048120, ISSN: 1829-1171.

(Continued)

*Primary Examiner* — Peniel M Gumedzoe
(74) *Attorney, Agent, or Firm* — Michelle S. Gallardo

(57) ABSTRACT

Pillars having a directed compliance geometry are arranged to couple a semiconductor die to a substrate. The direction of maximum compliance of each pillar may be aligned with the direction of maximum stress caused by unequal thermal expansion and contraction of the semiconductor die and substrate. Pillars may be designed and constructed with various shapes having particular compliance characteristics and particular directions of maximum compliance. The shape and orientation of the pillars may be selected as a function of their location on a die to accommodate the direction and magnitude of stress at their location. A method includes fabricating pillars with particular shapes by patterning to increase surface of materials upon which the pillar is plated or deposited.

19 Claims, 7 Drawing Sheets

(52) U.S. Cl.
CPC . *H01L2224/131* (2013.01); *H01L 2224/13012* (2013.01); *H01L 2224/13013* (2013.01); *H01L 2224/13014* (2013.01); *H01L 2224/13015* (2013.01); *H01L 2224/13017* (2013.01); *H01L 2224/13018* (2013.01); *H01L 2224/13082* (2013.01); *H01L 2224/13139* (2013.01); *H01L 2224/13144* (2013.01); *H01L 2224/13147* (2013.01); *H01L 2224/13155* (2013.01); *H01L 2224/1403* (2013.01); *H01L 2224/14051* (2013.01); *H01L 2224/14142* (2013.01); *H01L 2224/16057* (2013.01); *H01L 2224/17051* (2013.01); *H01L 2224/814* (2013.01); *H01L 2224/81211* (2013.01); *H01L 2224/81801* (2013.01); *H01L 2924/014* (2013.01); *H01L 2924/01006* (2013.01); *H01L 2924/01029* (2013.01); *H01L 2924/3512* (2013.01)

(56) References Cited

U.S. PATENT DOCUMENTS

| | | | |
|---|---|---|---|
| 6,493,238 B1 | 12/2002 | Pai | |
| 7,136,770 B2 | 11/2006 | Rivoir et al. | |
| 7,271,030 B2 | 9/2007 | Bojkov et al. | |
| 7,439,170 B1 | 10/2008 | Daubenspeck et al. | |
| 7,902,666 B1 | 3/2011 | Hsu et al. | |
| 2003/0085133 A1 | 5/2003 | Totsuka et al. | |
| 2004/0026107 A1* | 2/2004 | Caldwell et al. | 174/52.4 |
| 2004/0178250 A1* | 9/2004 | Cherian | 228/180.1 |
| 2005/0167832 A1 | 8/2005 | Kainou et al. | |
| 2005/0253264 A1 | 11/2005 | Aiba et al. | |
| 2006/0001159 A1 | 1/2006 | Garcia et al. | |
| 2006/0055032 A1 | 3/2006 | Chang et al. | |
| 2006/0186519 A1 | 8/2006 | Inoue et al. | |
| 2007/0207608 A1 | 9/2007 | Wang | |
| 2012/0012985 A1* | 1/2012 | Shen et al. | 257/618 |

FOREIGN PATENT DOCUMENTS

| | | | |
|---|---|---|---|
| JP | 3190238 | A | 8/1991 |
| JP | H05152381 | A | 6/1993 |
| JP | 6097347 | A | 4/1994 |
| JP | H0697347 | A | 4/1994 |
| JP | H0945733 | A | 2/1997 |
| JP | 2709494 | B2 | 2/1998 |
| JP | 2821777 | B2 | 11/1998 |
| JP | 11340352 | A | 12/1999 |
| JP | H11340352 | A | 12/1999 |
| JP | 2001156097 | A | 6/2001 |
| JP | 2004014778 | A | 1/2004 |
| JP | 2007142017 | A | 6/2007 |
| JP | 2007242782 | A | 9/2007 |
| WO | 2004051748 | A1 | 6/2004 |
| WO | 2005066391 | A1 | 7/2005 |

OTHER PUBLICATIONS

International Search Report and Written Opinion—PCT/US2012/047722—ISA/EPO—Jan. 3, 2013.
Moffat T.P., et al.,"Curvature Enhanced Adsorbate Coverage Model for Electrodeposition", Journal of the Electrochemical Society, vol. 153, No. 2, 2006, pp. C127-C132, XP008069097, ISSN: 0013-4651, DOI: 10.1149/1.2165580.
Partial International Search Report—PCT/US2012/047722—ISA/EPO—Jul. 9, 2013.

* cited by examiner

INTERCONNECT PILLARS WITH DIRECTED COMPLIANCE GEOMETRY

FIELD OF THE DISCLOSURE

The present disclosure is in the field of semiconductor packaging and more particularly in the field of copper pillar interconnects in semiconductor packaging.

BACKGROUND

Integrated circuit (IC) fabrication processes have produced ICs with reduced node spacing in the range of 48 nm and 28 nm nodes, for example. Material having an extremely low dielectric constant (ELK) has been used to accommodate the reduced node spacing and to enhance electrical performance of the ICs that are produced with such small node spacing. The ELK material may include relatively porous material which may be susceptible to cracking in response to certain stresses.

Interconnect pillars constructed from more rigid conductive materials such as copper have been used along with solder in certain solder bump connections between a semiconductor die and a substrate. In electronic packaging, for example, a flip chip can include a pillar that extends from a contact on a die or wafer to a solder connection on a substrate. The solder connection can be a solder on pad (SOP) connection, for example.

The use of pillars provides an improvement over earlier semiconductor interconnect techniques by allowing a very high density of interconnects. The metallurgical properties of the pillars compared to earlier solder structures allow the smaller pitch connections to maintain an appropriate standoff distance between a semiconductor die and a substrate to which it is connected. The use of copper pillars also reduces electromigration (EM) in the interconnects. However, the use of copper pillars can make a backend silicon structure more susceptible to cracking during package assembly.

During the processing of flip chips, the substrate and semiconductor die are subject to substantial heating and cooling. The semiconductor die may be constructed from a material such as silicon which has a coefficient of thermal expansion (CTE) of about $2.6 \times 10^{-6}/°$ C. and the substrate may have a CTE in the range of about $15 \times 10^{-6}/°$ C. to about $17 \times 10^{-6}/°$ C. The CTE mismatch between the substrate and die causes the substrate to expand and contract more than the die during a heating and cooling cycle. In packages that include interconnects with copper pillars rather than traditional solder bumps to accommodate finer bump pitch, the copper of the pillars may not be able to deform enough to take up the stress caused by the thermal expansion mismatch between the die and substrate. The higher Young's modulus of the copper pillar causes more of the stress to be "transferred" to the sensitive ELK layers of the die. This increases the chance for ELK layer cracking for flip chip type interconnects. Such cracking due to high stress in the Extremely Low Dielectric Constant (ELK) layers is a common failure of semiconductor packages.

SUMMARY

For a more complete understanding of the present disclosure, reference is now made to the following detailed description and the accompanying drawings. In an exemplary embodiment, a pillar for a flip chip interconnect is provided. The pillar includes an electrically conductive material such as copper, gold or silver.

An apparatus according to an aspect of the present disclosure includes a semiconductor die and at least one conductive pad disposed on a surface of the semiconductor die. At least one pillar is coupled to the conductive pad. The pillar(s) have a non-uniform compliance geometry defining a compliant direction for each pillar.

According to another aspect of the disclosure, an apparatus includes a semiconductor die and a number of conductive pads disposed on a surface of the semiconductor die. A first pillar that has a first pillar geometry is coupled to one of the conductive pads at a first location on the semiconductor die. A second pillar has a second pillar geometry that is different from the first pillar geometry. The second pillar is coupled to a different one of the conductive pads at a second location on the semiconductor die.

Another aspect of the present disclosure provides a method for packaging a semiconductor die. The method includes fabricating a number of conductive pads on a surface of the semiconductor die. A first pillar that has a first pillar geometry is deposited on one of the conductive pads at a first location on the semiconductor die. A second pillar that has a second pillar geometry different from the first pillar geometry is deposited on a different one of the conductive pads at a second location on the semiconductor die.

Yet another aspect of the present disclosure provides an apparatus for packaging a semiconductor die. The apparatus includes means for fabricating conductive pads on a surface of the semiconductor die and means for depositing a first pillar that has a first pillar geometry on one of the conductive pads at a first location on the semiconductor die. The apparatus also includes means for depositing a second pillar that has a second pillar geometry different from the first pillar geometry on a different one of the conductive pads at a second location on the semiconductor die.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The accompanying drawings are presented to aid in the description of embodiments. The drawings are provided solely for illustration of the embodiments and not limitation thereof.

DETAILED DESCRIPTION

Figure 1:
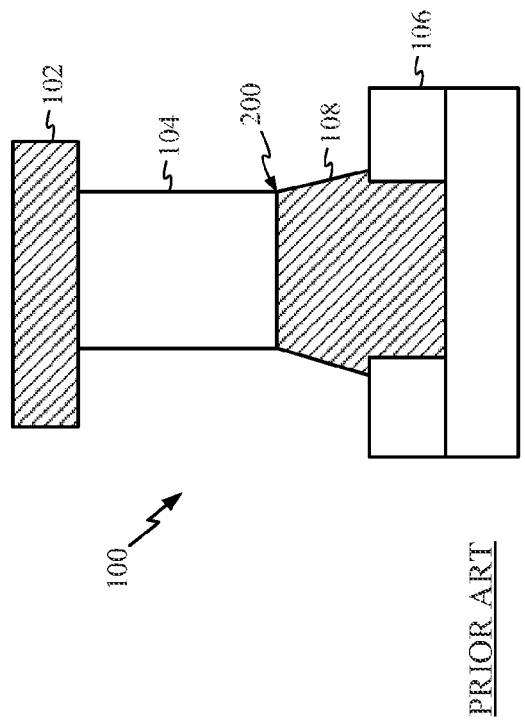
FIG. 1 is a diagram illustrating a conventional flip chip package prior to attachment.
Figure 2:
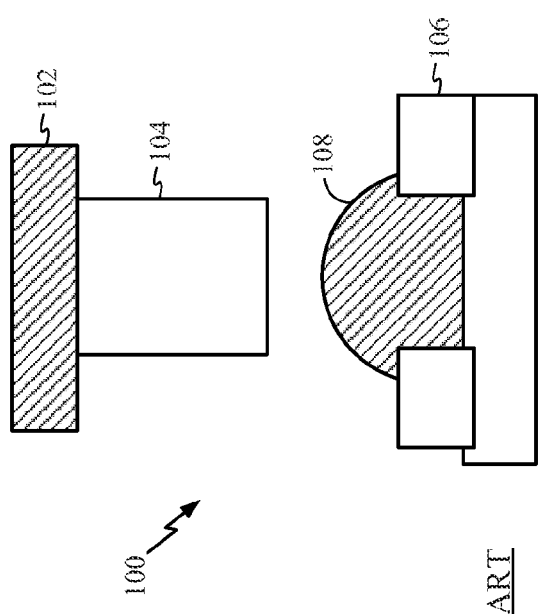
FIG. 2 is a schematic view of the conventional flip package of FIG. 1 after attachment.

Referring to FIG. 1, a conventional flip chip package design is described. The flip chip package 100 includes a die or wafer 102 from which a pillar 104 extends. The flip chip package 100 is complete when the die or wafer 102 is coupled to a substrate 106. A solder bump 108 is disposed on the substrate 106 for coupling to the pillar 104. In FIG. 2, for example, the solder material 108 couples to the pillar 104 and forms a conductive connection 200. While there is only one conductive connection 200 shown in FIG. 2, there can be multiple conductive connections between pillars 104 and solder bumps 108.

A conventional pillar has a symmetrical geometry and does include any particular directionality. For example, conventional pillars used in semiconductor packaging are substantially cylindrical and form an electrically conductive interconnect with the substrate through a solder on pad (SOP) connection. To reduce the susceptibility of the ELK layer to cracking and increase the robustness of the ELK layers, aspects of the present disclosure provide a directionally oriented pillar design on a semiconductor die or wafer. This reduces the stress on the ELK layers.

Figure 3A:
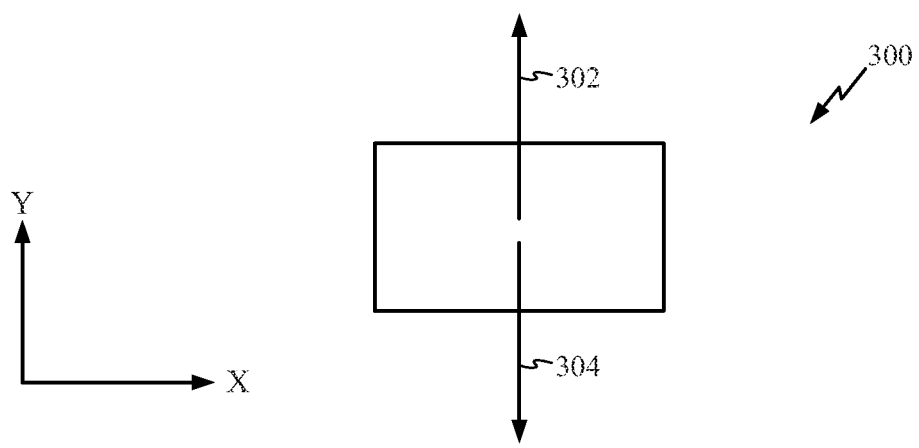
FIGS. 3A and 3B are schematic diagrams of a pillar having particular directions of maximum compliance according to aspects of the present disclosure.

Referring to FIG. 3A, a directionally oriented pillar 300 is described according to one aspect of the disclosure. In this embodiment, shown in a top view, the pillar 300 includes a generally rectangular cross section. Because of the rectangular geometry, the pillar 300 is more compliant to stresses in the direction of the shorter side of the rectangle, shown as the "Y" direction, than it is in the direction of the longer side of the rectangle, shown as the "X" direction. The directions of maximum compliance 302, 304 of the pillar 300 are therefore normal to the "X" direction.

Figure 3B:
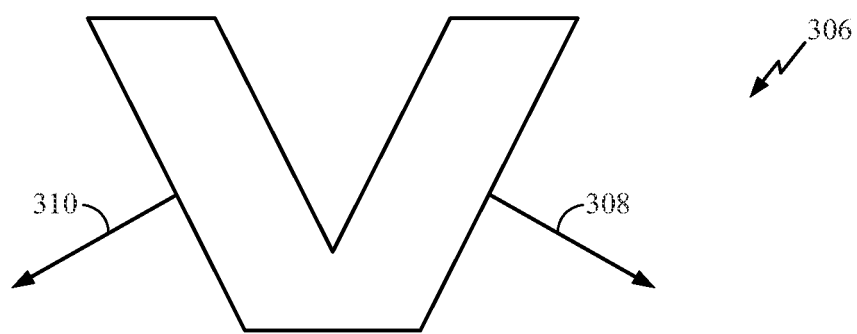

Although the rectangular pillar 300 is compliant in two directions 302, 304, along the same line alternative aspects of the present disclosure provide pillars of different shapes which may have a single direction of maximum compliance or multiple different directions of maximum compliance. For example, FIG. 3B shows a V shaped pillar 306 having two compliance directions 308 and 310 oriented along different lines. In another aspect, different heights of material within a pillar can be designed to affect the compliance geometry, as shown in FIGS. 6A-F.

Figure 4:
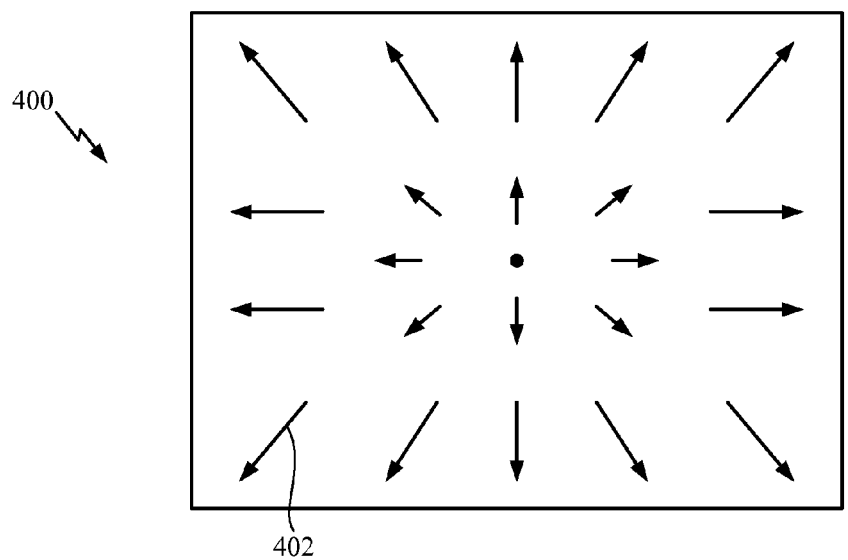
FIG. 4 is diagram illustrating different stress magnitudes at different locations on a semiconductor die.

The mismatched thermal expansion of a die and substrate causes more relative displacement or the die and substrate in some areas of the die and less relative displacement in other areas of the die. For example, if the die is centered relative to the substrate, the central portion of the die may be subject to little or no displacement relative to the central portion of the substrate. In contrast the edges of a die may be subject to significant displacement relative to the edge portions of a substrate. These different relative displacements cause the stress on a pillar to vary as a function of location on the die. FIG. 4, shows a top view of a die 400 in which stress 402 on a pillar due to mismatched thermal expansion is shown by the length of arrows.

Figure 5:
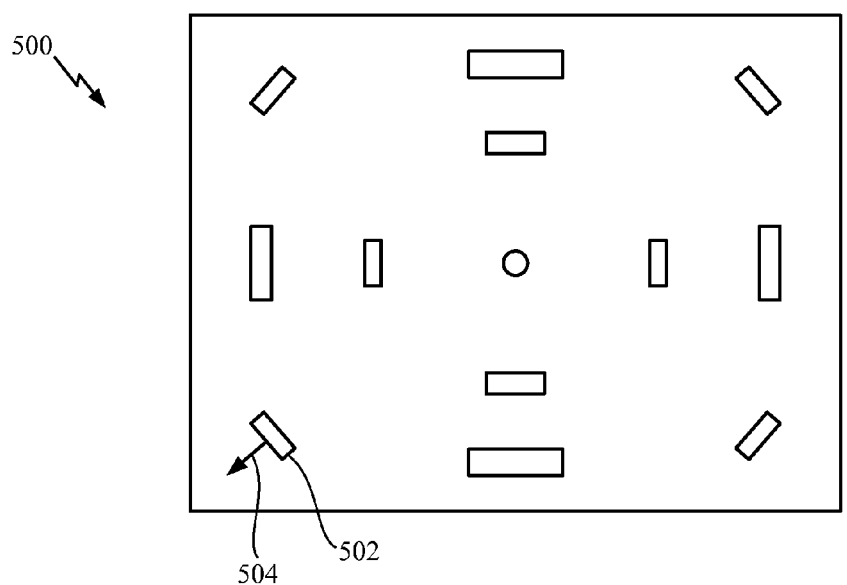
FIG. 5 is a diagram illustrating placement and orientation of pillars having a direction of maximum compliance aligned with local maximum stress according to an aspect of the present disclosure.

FIG. 5 shows an aspect of the present disclosure in which pillars 502 are shaped to have a direction of maximum compliance. The pillars 502 are oriented on the die 500 as a function of their location on the die 500 so that their direction of maximum compliance 504 for each pillar 502 corresponds to direction of the maximum stress due to CTE mismatch of the die 500 and substrate (not shown).

In addition to orienting similarly shaped pillars as a function of their position on a die, aspects of the present disclosure also may include using differently shaped pillars as a function of their position on a die. For example, a pillar that is located near the center of a die and thereby subject to very little stress due to CTE mismatch may have a circular cross section having no particular direction of maximum compliance. On the same die, a pillar that is located near the edge may have a rectangular cross section to absorb large stresses due to CTE mismatch.

Figure 6A:
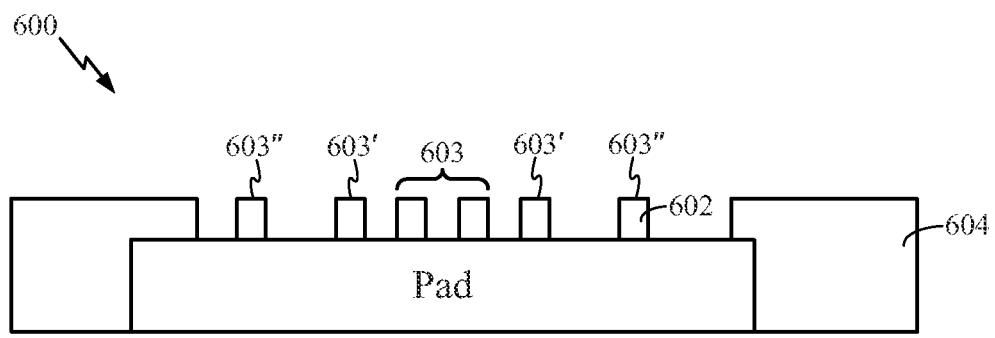
FIGS. 6A-6F are schematic diagrams illustrating processes for forming shaped pillars on a semiconductor die according to aspects of the present disclosure.

Another aspect of the present disclosure provides a method for depositing material to form pillars of various shapes on a semiconductor die. Referring to FIG. 6A, the method includes depositing or etching a pattern 602 in a material 604 such as a passivation material on an area of the die 600 where the pillar is to be provided. The pattern 602 includes an increased surface area at locations where an increased pillar height is desired and a lower surface area where a lower pillar height is desired.

The exemplary pattern 602 shown as a cross section in FIG. 6A includes a series of rings 603, 603', 603" in which different locations in the pattern provide different surface area according to the pattern density of the rings. The surface area of the pattern 602 is relatively greater toward an inner ring 603 where the rings are spaced more closely than they are spaced near the outer ring 603". According to aspects of the disclosure, the greater surface area of the pattern 602 toward the inner ring 603 increases the pillar height in the center of the pattern 602, and the lower surface area of the pattern 602 toward the outer ring 603" results in decreased pillar height toward the outer edge of the pattern 602.

Figure 6B:
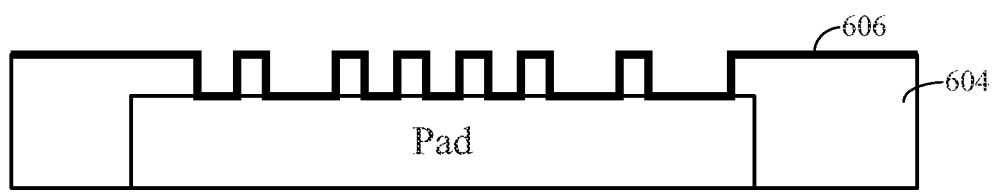
Figure 6C:
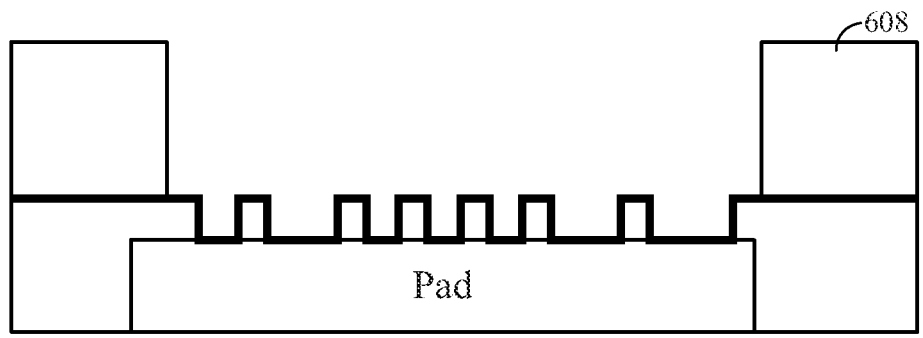
Figure 6D:
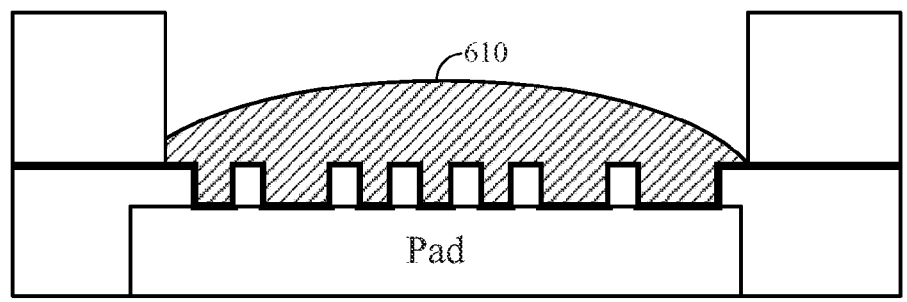
Figure 6E:
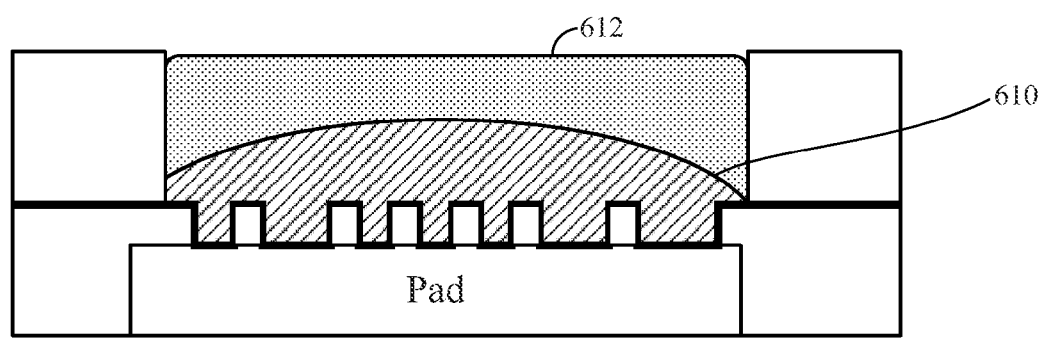
Figure 6F:
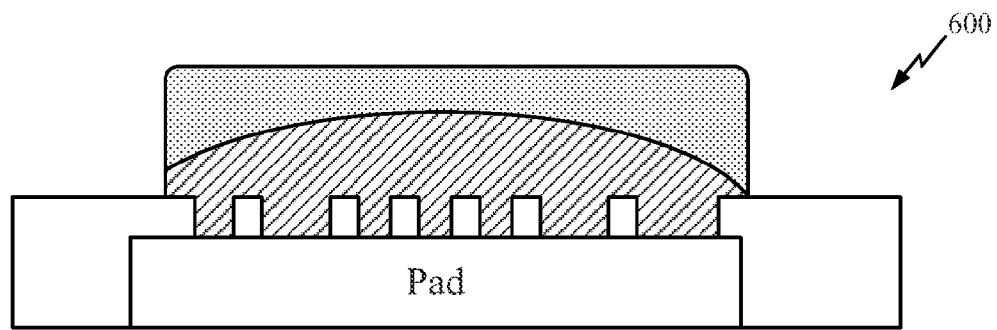

Referring to FIG. 6B a first under bump metallization layer (UBM-1) 606 is deposited over the passivation layer 604, using a physical vapor deposition (PVD) process, for example. Referring to FIG. 6C, a photo resist pattern 608 is then applied around the pillar area. In FIG. 6D, high accelerator plating is performed to form the pillar 610 by plating to higher thickness where there is a higher surface area of the UBM-1 layer. In FIG. 6E, solder 612 may be applied to the pillar 610. In FIG. 6F, the photo resist pattern is stripped and the UBM material adjacent to the pillar is etched away from the die 600.

Figure 7:
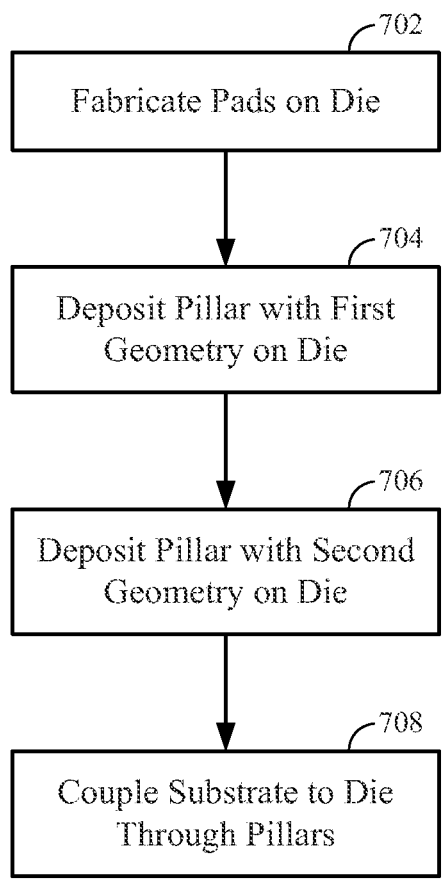
FIG. 7 is a process flow diagram showing coupling of a semiconductor die to a substrate according to aspects of the present disclosure.

FIG. 7 is a process flow diagram for coupling a semiconductor die to a substrate according to aspects of the present disclosure. In block 702, conductive pads are fabricated at different locations on a surface of the semiconductor die. In block 704, a first pillar with a first pillar geometry is deposited on one of the conductive pads. In block 706, a second pillar with a different geometry from the first pillar is deposited onto a different one of the conductor pads. In block 708, a substrate is coupled through the pillars to the semiconductor die.

Figure 8:
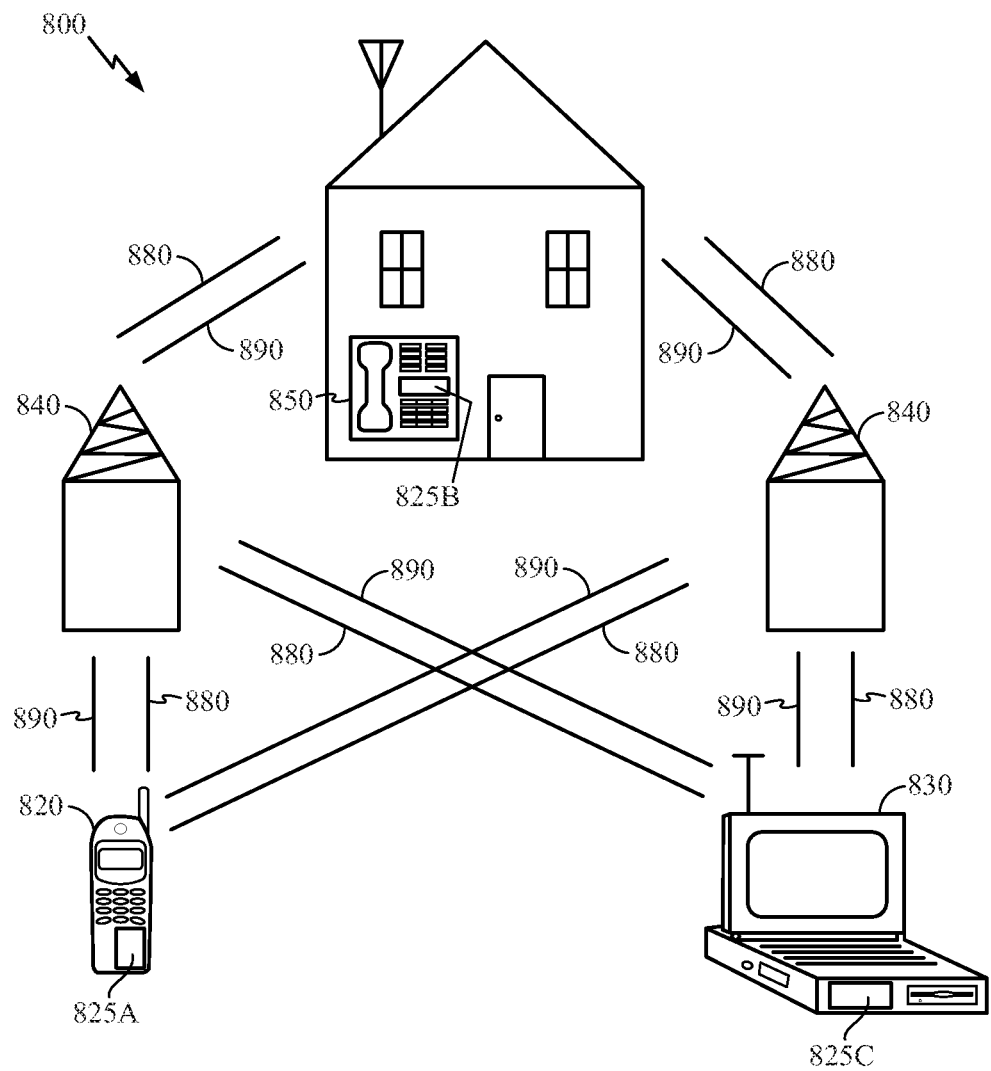
FIG. 8 is a block diagram showing an exemplary wireless communication system in which a semiconductor die coupled to a substrate with shaped pillars may be advantageously employed.

FIG. 8 shows an exemplary wireless communication system 800 in which an embodiment of an electronic package with an improved flip chip interconnect may be advantageously employed. For purposes of illustration, FIG. 8 shows three remote units 820, 830, and 850 and two base stations 840. It should be recognized that typical wireless communication systems may have many more remote units and base stations. Any of remote units 820, 830, and 850, as well as the base stations 840, may include an electronic package with an improved flip chip interconnect such as disclosed herein. FIG. 8 shows forward link signals 880 from the base stations 840 and the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 8 illustrates certain exemplary remote units that may include an electronic package with an improved flip chip interconnect as disclosed herein, the package is not limited to these exemplary illustrated units. Embodiments may be suitably employed in any electronic device in which an electronic package with an improved flip chip interconnect is desired.

Although certain aspects of the present disclosure are described in terms of a copper pillar, it should be understood that other materials such as nickel, gold and silver may also be used to form pillars according various aspects of the disclosure.

Although the term "pillar" is used throughout the present disclosure to describe a particular structure for coupling a semiconductor die to a substrate, it should be understood that various other terms such as "post" and "bump," for example, are commonly used for the same general type of structure. Although the term "interconnect" is used throughout the present disclosure, it should be understood that various other terms such as "connection" and "joint," for example, to describe the same type of structure.

While exemplary embodiments incorporating the principles of the present disclosure have been disclosed hereinabove, the present disclosure is not limited to the disclosed embodiments. Instead, this application is intended to cover any variations, uses, or adaptations of the disclosure using its general principles. Further, this application is intended to cover such departures from the present disclosure as come within known or customary practice in the art to which this disclosure pertains and which fall within the limits of the appended claims.

What is claimed is:

1. An apparatus, comprising:
a semiconductor die;
a plurality of conductive pads disposed on a surface of the semiconductor die; and
a plurality of pillars coupled to the plurality of conductive pads, each pillar having a shape and a direction of maximum compliance corresponding to a direction of pillar stress, the direction of maximum compliance for each pillar being a function of the shape of the pillar, the shape and direction of maximum compliance for each pillar being a function of a location of the pillar on the semiconductor die;
a first pillar, from the plurality of pillars, at a first location having a first shape that is different from a second shape of a second pillar, from the plurality of pillars, at a second location; and
a first conductive pad, from the plurality of conductive pads, including a plurality of concentric rings upon which the first pillar is coupled.

2. The apparatus of claim 1, in which the direction of maximum compliance for each pillar is aligned with the direction of pillar stress for the pillar.

3. The apparatus of claim 2, in which the direction of pillar stress is a direction of maximum thermal expansion of the die.

4. The apparatus of claim 1, in which the plurality of pillars are distributed at different locations on the surface of the semiconductor die and arranged with different maximum compliance directions corresponding to the different locations.

5. The apparatus of claim 4, further comprising:
a substrate coupled by the plurality of pillars to the semiconductor die, the substrate including a plurality of solder joints coupled to the plurality of the pillars,
in which the different maximum compliance directions of the pillars correspond to a direction of maximum thermal expansion of the substrate relative to the semiconductor die for each of the different locations.

6. The apparatus of claim 1, integrated into at least one of a mobile phone, a set top box, a music player, a video player, an entertainment unit, a navigation device, a computer, a hand-held personal communication systems (PCS) unit, a portable data unit, or a fixed location data unit.

7. The apparatus of claim 1, in which a size of each pillar is a function of the location of the pillar on the semiconductor die such that the size of the first pillar, from the plurality of pillars, at the first location is different from the size of the second pillar, from the plurality of pillars, at the second location.

8. The apparatus of claim 1, in which the shape of each pillar is a function of a distance of the pillar from a central portion of the semiconductor die such that the shape of the first pillar, from the plurality of pillars, at a first distance from the central portion is different from the shape of the second pillar, from the plurality of pillars, at a second distance from the central portion.

9. The apparatus of claim 1, in which a size of each pillar is a function of a distance of the pillar from a central portion of the semiconductor die such that the size of the first pillar, from the plurality of pillars, at a first distance from the central portion is different from the size of the second pillar, from the plurality of pillars, at a second distance from the central portion.

10. The apparatus of claim 1, wherein a first spacing between the concentric rings of the first conductive pad is determinative of a height of the first pillar formed on the first conductive pad.

11. The apparatus of claim 10, wherein a second spacing between the concentric rings of the second conductive pad is determinative of a height of the second pillar formed on the second conductive pad, the second spacing different from the first spacing such that the height of the second pillar is different than the height of the first pillar.

12. The apparatus of claim 1, wherein each conductive pad includes a corresponding set of concentric rings.

13. An apparatus, comprising:
a semiconductor die;
a plurality of conductive pads disposed on a surface of the semiconductor die;
a first pillar having a first pillar geometry coupled to a first conductive pad, from the plurality of conductive pads, at a first location on the semiconductor die, the first pillar geometry comprising a first pillar shape;

a second pillar having a second pillar geometry different from the first pillar geometry, the second pillar geometry comprising a second pillar shape different from the first pillar shape, the second pillar coupled to a second conductive pad, from the plurality of conductive pads, at a second location on the semiconductor die, each pillar having a direction of maximum compliance corresponding to a direction of pillar stress for the pillar, the direction of maximum compliance for each pillar being a function of the shape of the pillar, the first and second pillar shapes and the direction of maximum compliance for each pillar being a function of a location of the corresponding pillar on the semiconductor die, and the first conductive pad including a first set of concentric rings upon which the first pillar is coupled, the second conductive pad including a second set of concentric rings upon which the second pillar is coupled.

14. The apparatus of claim 13, in which:
the first pillar geometry corresponds to a first thermal stress at the first location on the semiconductor die; and
the second pillar geometry corresponds to a second thermal stress at the second location on the semiconductor die.

15. The apparatus of claim 14, further comprising:
a substrate coupled through the first pillar and the second pillar to the semiconductor die.

16. The apparatus of claim 13, integrated into at least one of a mobile phone, a set top box, a music player, a video player, an entertainment unit, a navigation device, a computer, a hand-held personal communication systems (PCS) unit, a portable data unit, or a fixed location data unit.

17. The apparatus of claim 13, in which a size of each pillar is a function of the location of the pillar on the semiconductor die such that the size of the first pillar at the first location is different from the size of the second pillar at the second location.

18. The apparatus of claim 13, in which the shape of each pillar is a function of a distance of the pillar from a central portion of the semiconductor die such that the shape of the first pillar at a first distance from the central portion is different from the shape of the second pillar at a second distance from the central portion.

19. The apparatus of claim 13, in which a size of each pillar is a function of a distance of the pillar from a central portion of the semiconductor die such that the size of the first pillar at a first distance from the central portion is different from the size of the second pillar at a second distance from the central portion.

\* \* \* \* \*